(12) United States Patent
Frey et al.

(10) Patent No.: US 6,489,864 B2
(45) Date of Patent: Dec. 3, 2002

(54) FILTER FOR ELECTRIC SIGNALS

(75) Inventors: Wilhelm Frey, Palo Alto, CA (US); Karsten Funk, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/805,830

(22) Filed: Mar. 14, 2001

(65) Prior Publication Data

US 2001/0022546 A1 Sep. 20, 2001

(30) Foreign Application Priority Data

Mar. 17, 2000 (DE) .......................... 100 13 424

(51) Int. Cl.⁷ ................................. H03H 9/48
(52) U.S. Cl. ...................... 333/197; 310/330
(58) Field of Search ............... 333/18; 310/332, 310/330

(56) References Cited

U.S. PATENT DOCUMENTS 5,552,655 A * 9/1996 Stokes et al. ............... 310/321

OTHER PUBLICATIONS

Wang et al., Free–Free Beam High–Q Micromechanical Resonators, *Journal of Microelectromechanical System*, vol. 9, No. 3, Sep. 2000, pp. 347–360.

* cited by examiner

*Primary Examiner*—Benny Lee
*Assistant Examiner*—Wesley Harris
(74) *Attorney, Agent, or Firm*—Kenyon & Kenyon

(57) ABSTRACT

A filter for electric signals has a substrate, a vibrating body capable of vibrating with at least two antipodes deflected in phase opposition relative to the substrate and has electrodes connected to a signal input and a signal output for electric excitation and for detection of the vibration of the vibrating body. The electrodes for detecting the vibration, each assigned to antipodes deflected in phase opposition, are connected to two separate terminals of the signal output.

13 Claims, 4 Drawing Sheets

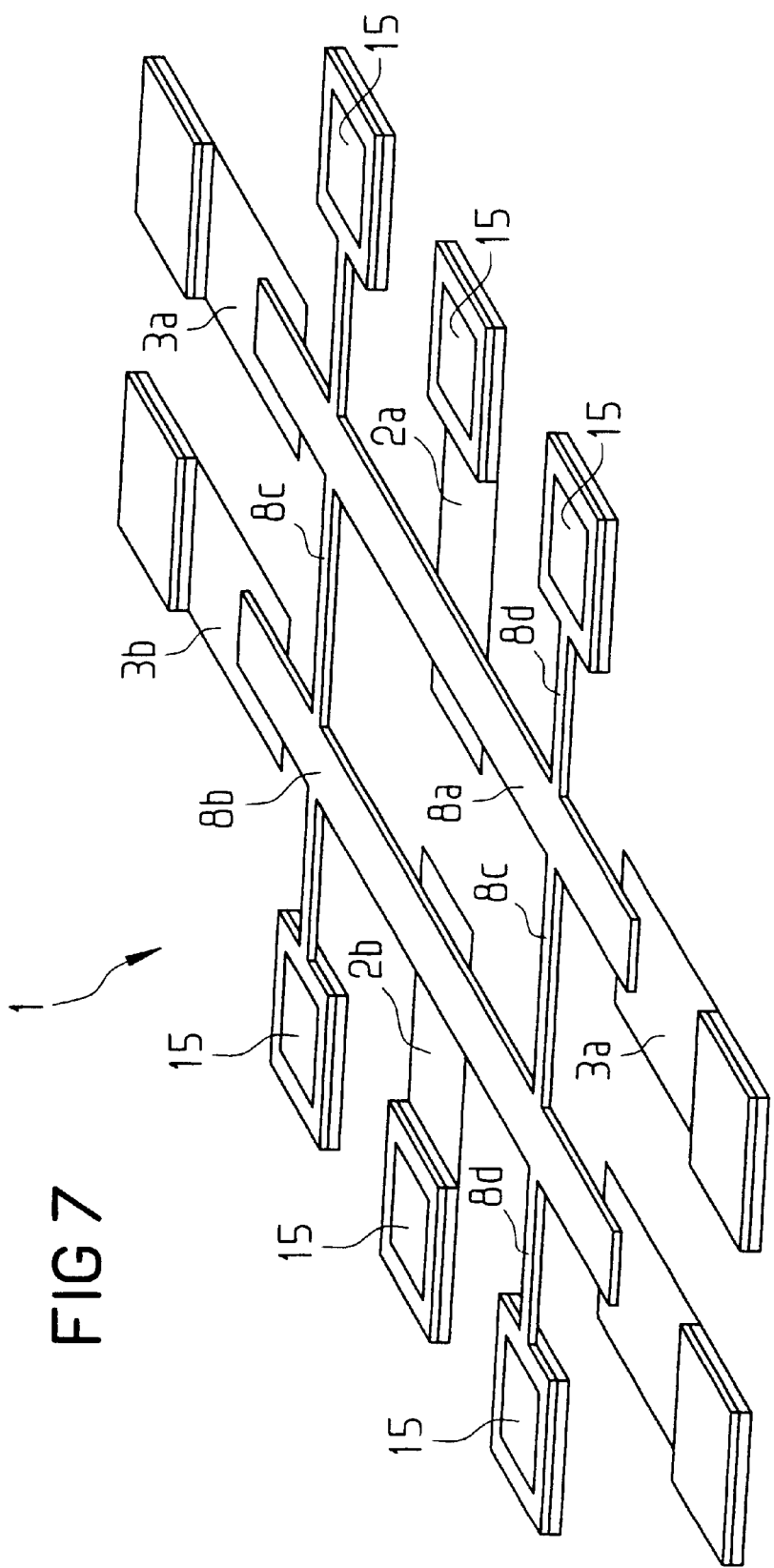

FILTER FOR ELECTRIC SIGNALS

FIELD OF THE INVENTION

The present invention relates to a filter for electric signals, having a substrate, a body that vibrates relative to the substrate, and electrodes connected to a signal input and/or output for electric excitation and/or detection of vibration of the body.

BACKGROUND INFORMATION

The filter effect of the mechanical transmission response of a weekly attenuated vibrating structure has long been known. Mainly surface wave filters are used today in electronic communications processing. This type of filter is usually made of a piezoelectric material at whose surface are mounted electrodes that intermesh like combs, producing at the surface electric fields with polarities that alternate in the longitudinal direction of the comb structures. These fields induce a piezoelectric deformation of the material, which thus induces surface waves at a suitable frequency of a voltage applied between the electrodes. Since these filters use a piezoelectric substrate material, they are not suitable for monolithic integration into semiconductor structures.

Therefore, work has already been underway for several years on micromechanical structures that can be produced from a semiconductor material and, when operated as resonators, have an electromechanical filter response. Such a filter is described, for example, by Kun Wang, Yinglei Yu, Ark-Chew Wong and Clark T. C. Nguyen, "Free-Free Beam High-Q Micromechanical Resonators."

One problem with these known micromechanical resonators is the parasitic overcoupling, i.e., signal paths created by parasitic capacitance between the signal input and output of the resonator, through which the input signal crosses over directly to the filter output and is thus overlaid on the filter response, sometimes massively.

To counteract this problem, filters with a compensating capacitance or differential capacitor arrangements with downstream formation of the difference have been developed. The effect of these arrangements is based on the fact that a signal with a 180° phase shift is passed through a capacitance similar to the parasitic capacitance to thereby obtain a signal simulating the parasitic signal but with the opposite polarity; this signal can then be superimposed additively on the filter output signal to eliminate the effect of the parasitic capacitance. For example, a dummy resonator structure can be constructed for this purpose to simulate the electric response of the resonator except for the resonance.

In the case of a differential capacitor arrangement, an electrode is mounted above and below the vibrating body, for example. When the body swings upward, the distance from the upper electrode becomes smaller and thus the capacitance between the upper electrode and the vibrating body becomes greater, while at the same time the capacitance between the lower electrode and the body becomes smaller. With a suitable design, the parasitic capacitances for both electrodes will be the same. By forming the difference between the signals from the upper and lower electrodes, the influence of parasitic capacitance can be largely eliminated.

Neither approach for eliminating the problem of parasitic capacitance is completely satisfactory. When using compensating capacitances, for example, knowledge of the exact parasitic capacitance and its frequency response allows construction of a suitable dummy resonator. This involves extremely complicated development work, and a dummy resonator structure developed for a given resonator structure cannot readily be applied to a newly designed resonator.

Using the differential capacitance requires that electrodes be mounted in different planes above and below the vibrating body. Such a design is simpler to develop, but the need for electrodes arranged at different levels makes production of such a resonator more complicated and expensive.

SUMMARY OF THE INVENTION

The filter according to the present invention for electric signals has the advantage of being insensitive to parasitic capacitances, requiring little development effort and being inexpensive to manufacture in comparison with the known technology.

The idea on which the present invention is based is that the electrodes for detecting the vibration which are assigned to antipodes that are deflected in phase opposition are connected to two separate terminals of the signal output. This makes it possible to mount each electrode on the substrate on one side of the vibrating body while nevertheless varying the capacitance between the electrodes and the vibrating body in phase opposition.

Vibration of the movable body in question here is antisymmetrical, i.e., changing polarity as the body moves to either side of an axis of symmetry, and the electrodes are arranged symmetrically with respect to this plane of symmetry of vibration. This guarantees that the amplitude of motion of the vibrating body will be the same in the area of the electrodes.

In the simplest case, which is the preferred case, the vibration is the first harmonic of the fundamental mode of the bending vibration of the body.

According to a preferred further embodiment of the filter, a control electrode is mounted in allocation to an area between two antipodes of the vibration, and a control potential can be applied to this control electrode for tuning the resonant frequency of the body. With the help of such an electrode, the resonant frequency of the filter, which would otherwise be predetermined in a fixed manner by the manufacturer, can be adapted to prevailing needs. With the help of such a control electrode, the resonant frequency of the vibrating body can be manipulated even after manufacturing the filter; for example, a filter installed in a circuit can be fine tuned with the help of a potential applied to the control electrode.

Because of the higher symmetry in excitation and detection of the vibration, it is preferable to have an electrode connected to the signal input arranged in the area of one antipode of the vibrating body to excite the vibration and an electrode connected to the terminal of the signal output to detect the vibration.

As an alternative, one electrode may be arranged in the area of each antipode, connectable by time division multiplexing to a terminal of the signal input for exciting the vibration and to a terminal of the signal output for detecting the vibration. This design results in a highly effective capacitive decoupling of the chronological separation of excitation and detection of the vibration.

In one embodiment of the filter which is preferred because of its simplicity, the movable body includes at least one bar fixedly connected to the substrate at its longitudinal ends.

As an alternative, the vibrating body may have at least one bar connected to the substrate by arms acting on nodes of vibration.

Especially good decoupling of input and output signals can also be achieved by providing the electrodes for excitation on one of these partial bodies and the electrodes for detecting the vibration on the other partial body. The resulting spatial separation of excitation and detection electrodes effectively limits capacitive signal overcoupling from the excitation electrode to the detection electrode.

The two partial bodies are preferably mechanically connected by an arm arranged in the area of one node of vibration. This connection offers an important advantage. It acts on the partial body at the center between the excitation electrodes, i.e., exactly at the point where the voltage drop is compensated by material-induced ohmic resistance in the partial body and also where electrostatic leakage fields are mutually minimized, thus also minimizing a charge flow which might be induced between the partial bodies due to the excitation, so that maximum suppression of the overcoupling from the excitation electrodes to the detection electrodes by way of the vibrating body is achieved.

The coupling between the two partial bodies is preferably not rigid, but instead the two are loosely connected. Thus with the help of a control electrode which can receive a control potential and is mounted on each partial body in an area between two antipodes of the vibration, it is possible to tune the resonant frequencies of the partial bodies independently within certain limits. This results in an increase in resonant width of the entire filter. In other words, not only the position but also the width of the feed-through window of the filter can be influenced by the applied control voltage. This effect can also be additionally utilized to compensate for temperature-induced attenuation properties of the vibratory motion which affect filter quality.

Since the filter according to the present invention may be made of a semiconductor material, circuits for pre- and/or postprocessing of the signal to be filtered can be integrated into the same substrate in an expedient manner.

BRIEF DESCRIPTION OF THE DRAWINGS

FIG. 7 shows a perspective view of another embodiment of a filter according to the present invention.

DETAILED DESCRIPTION

In the figures the same reference numbers are used to denote the same elements or elements having the same function.

Figure 1:
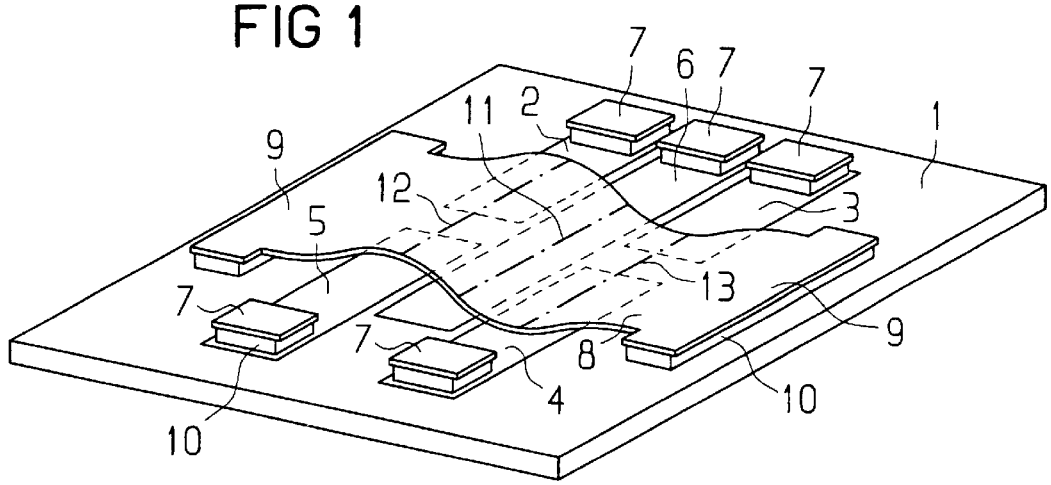
FIG. 1 shows a schematic perspective view of a filter according to the present invention having a single vibrating body.

FIG. 1 shows a perspective view of a filter according to a first embodiment of the present invention. This filter is manufactured from a semiconductor material using techniques known from the manufacture of integrated circuits. It includes a planar, essentially insulating, substrate 1 in which a plurality of conductive electrodes 2 through 6 are formed, e.g., by diffusion of foreign atoms into the substrate or by deposition of metal on the surface of the substrate.

Each of the electrodes has a contact pad 7 which is an input or output terminal of the filter and to which a wire can be connected by the traditional bonding method for supplying a signal to be filtered and for picking up the filtered signal. For the purposes of the present description, it is assumed that pads 7 of two electrodes 2, 3 each form a signal input of the filter, and pads 7 of electrodes 4, 5 each form a signal output. Electrode 6 has a special function which will be discussed in detail below.

A bar-shaped or band-shaped vibrating body 8 runs between contact pads 7 arranged in two rows at a distance from the surface of substrate 1. It is connected at its longitudinal ends 9 to substrate 1 by residues 10 of an intermediate layer which has otherwise been etched away beneath vibrating body 8. Residues of the same intermediate layer 10 also remain in contact pads 7.

Vibrating body 8 is shown in the figures with a sinusoidal curve to illustrate the vibrating motion to which it can be excited by a signal of a suitable frequency applied to input electrodes 2, 3. The amplitude of vibration has been drawn enlarged here to make the illustration clearer. Nodes of the bending vibration are located at longitudinal ends 9 fixedly connected to substrate 1; another node 11 extends linearly over the center of vibrating body 8. Antipodes 12, 13 of the vibration deflected in phase opposition are located on both sides of node 11. The vibration illustrated here is the first harmonic of the fundamental mode of the bending vibration of vibrating body 8. It is antisymmetrical, i.e., the deflection changes polarities when reflected on a plane passing through nodes 11.

The harmonic is excited as follows: by applying a potential to one of the input electrodes, e.g., electrode 3, an influencing charge with an opposite polarity is induced in vibrating body 8 with respect to electrode 3, resulting in electrostatic attraction between electrode 3 and its opposite antipode 13 of vibrating body 8. This produces a sinusoidal force as the attraction increases and decreases, i.e., a sinusoidal component is superimposed on a constant component. When the input signal passes through a certain point, vibrating body 8 extends again and then vibrates in the opposite direction in the second half period of vibration of the input signal.

Figure 3:
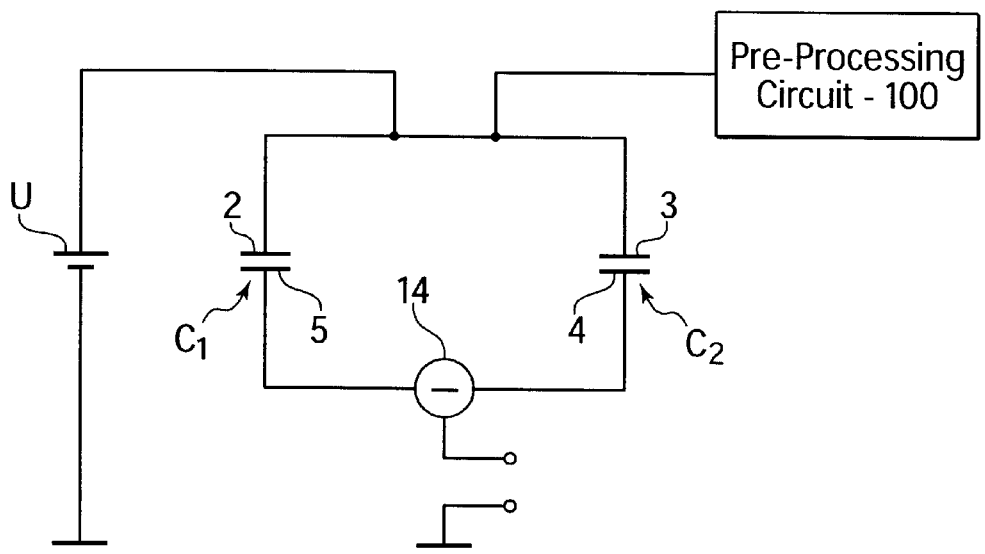
FIG. 3 shows a schematic diagram of how a filtered signal is obtained with the help of the filter according to the present invention.

The same vibrating motion also occurs in electrodes 4 and 5, which are connected to the signal output. Electrodes 2, 3, 4, 5 can each be equated to plates of two capacitors $C_1$, $C_2$ as in the schematic diagram in FIG. 3, their capacitances varying periodically according to the distance between electrodes 3, 4 and antipode 13 or electrodes 2, 3 and antipode 12. Since the two distances vary in opposite directions, the capacitance of capacitor $C_1$ is always at its maximum when that of $C_2$ is at its minimum and vice versa. The resulting difference in potential between electrodes 4 and 5 forms an output signal of the filter which can be picked up on contact pads 7 of electrodes 4, 5. A subtractor circuit 14 is connected to these contact pads, delivering a signal in proportion to the difference in potential or a current flow between two electrodes 4, 5.

Subtractor circuit 14 is an example of a post-processing circuit for processing the electric signal from the output electrodes, and, in the show embodiment, eliminates input signal components that are fed !through directly in common mode from input electrode 3 to adjacent output electrode 4, or from input electrode 2 to output electrode 5, unaffected by vibrating body 8. In addition, a pre-processing circuit 100 for processing the electric signal to input electrodes, such as electrodes 2, 3, may be provided, as shown by way of example in FIG. 3. The pre- and post-processing circuits according to the present invention may have one of several different suitable configurations, as readily recognizable by one skilled in the art.

Figure 2:
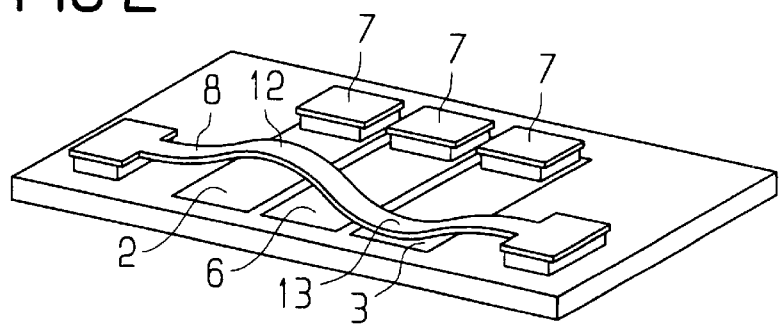
FIG. 2 shows a second embodiment of the filter having a single vibrating body.

FIG. 2 illustrates a second embodiment of the filter according to the present invention, omitting electrodes 4, 5. As in the embodiment described above, electrodes 2, 3 each run opposite antipodes 12 and 13 of vibrating body 8. An electrode 6 is also opposite center node 11 of vibrating body 8. In this embodiment, electrodes 2, 3 are used as input and output electrodes in time division multiplexing for exciting vibration of vibrating body 8 and for detecting vibration. In other words, electrodes 2, 3 are connected in cyclic alternation either in parallel to an input terminal to which a signal to be filtered is applied, exciting vibration of the vibrating body, or they are connected to two output terminals at which the oscillating potentials, induced by previously excited vibration of vibrating body 8, of electrodes 2, 3 which are then isolated from the input can be picked up. Since these output potentials can always be picked up only when electrodes 2, 3 are isolated from the input signal, this prevents an influence of the input signal on the output signal due to parasitic capacitance.

Figure 4:
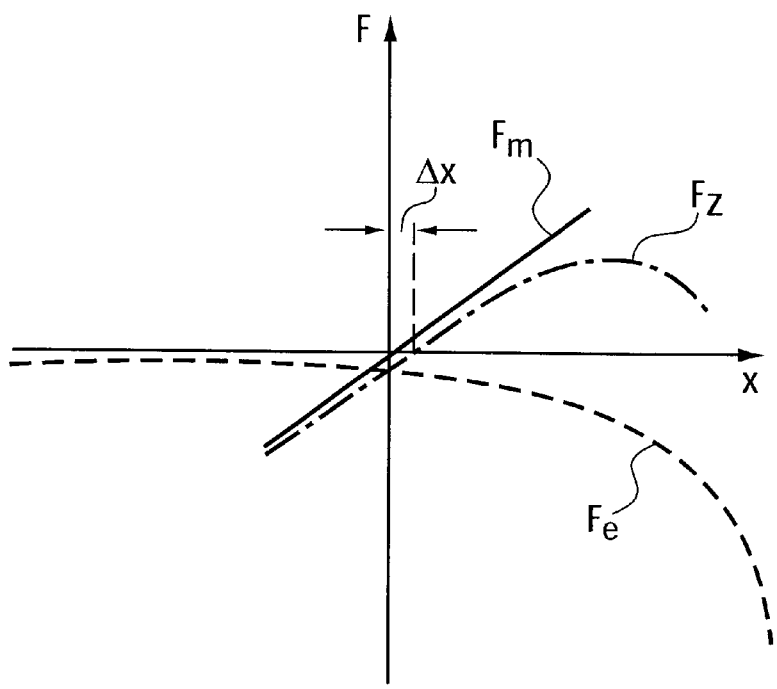
FIG. 4 shows the restoring force of the vibrating body as a function of its deflection without the control potential acting on the vibrating body and under the influence of a non-negligible control potential.

Now on the basis of FIG. 4, the function of electrode 6 which has been the same in the two embodiments discussed so far will be described.

When vibrating body 8 is deflected from its equilibrium position, it is subject to an elastic restoring force $F_m$ which can be assumed to be a linear function of the deflection for a sufficiently small deflection:

$$F_m = c \cdot x,$$

where c is the spring constant of the vibrating body and x is the deflection.

When a potential U different from ground is applied to electrode 6, it exerts on vibrating body 8 an electrostatic force which can be described approximately by the equation:

$$F_e = \tfrac{1}{2} U^2 A/(x_0 - x),$$

where A is the surface area of vibrating body 8 facing electrode 6, and $x_0$ is the value of the deflection at which contact would occur between the vibrating body and the electrode. As long as the potential U is negligibly small, the frequency of the vibrating motion of body 8 is determined only by spring constant c. When the potential U is different from zero, the equilibrium position of the vibrating body is shifted by a distance Δx in the direction of electrode 6, as shown in FIG. 4. The force acting on the vibrating body in this new equilibrium position is composed of the mechanical restoring force and the electrostatic attractive force. Since the restoring force increases with the deflection x, but the electrostatic attractive force behaves in the opposite manner, the slope of the total acting force $F_t = F_e + F_m$ in the new equilibrium position is less than c. Consequently, the frequency of vibration of vibrating body 8 decreases with an increase in the potential of electrode 6. The vibration frequency can thus be varied with the help of the potential of electrode 6.

This effect can be utilized to fine tune a filter to a vibration frequency which could not otherwise be achieved in a controlled manner due to the tolerance in the manufacture of vibrating body 8. This tunability can also be used to compensate for changes in vibration frequency of the filter caused by temperature or other ambient factors.

Figure 5:
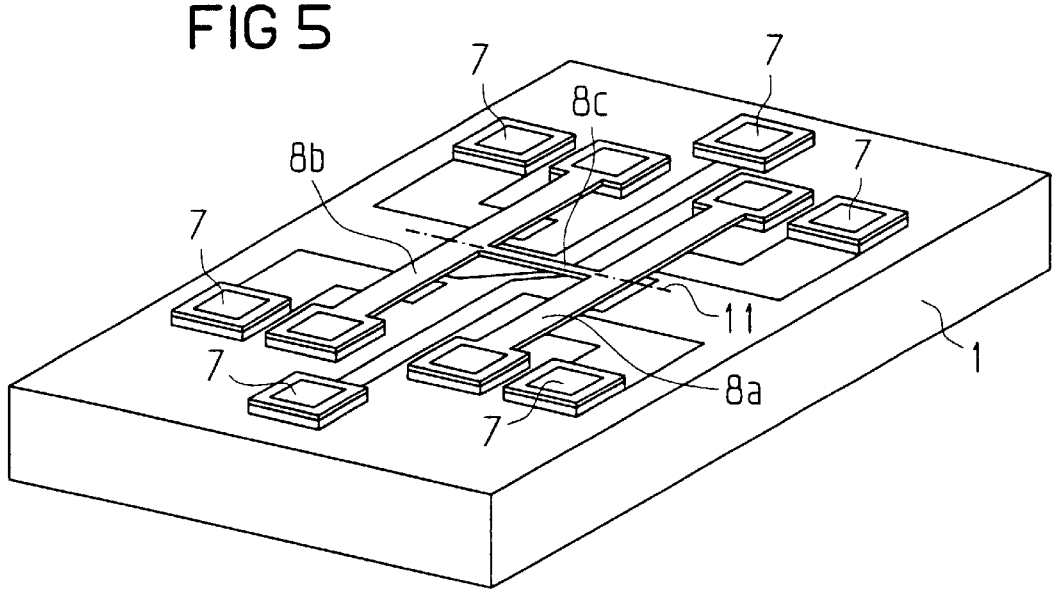
FIG. 5 shows a third embodiment of the filter according to the present invention in a perspective view.
Figure 6:
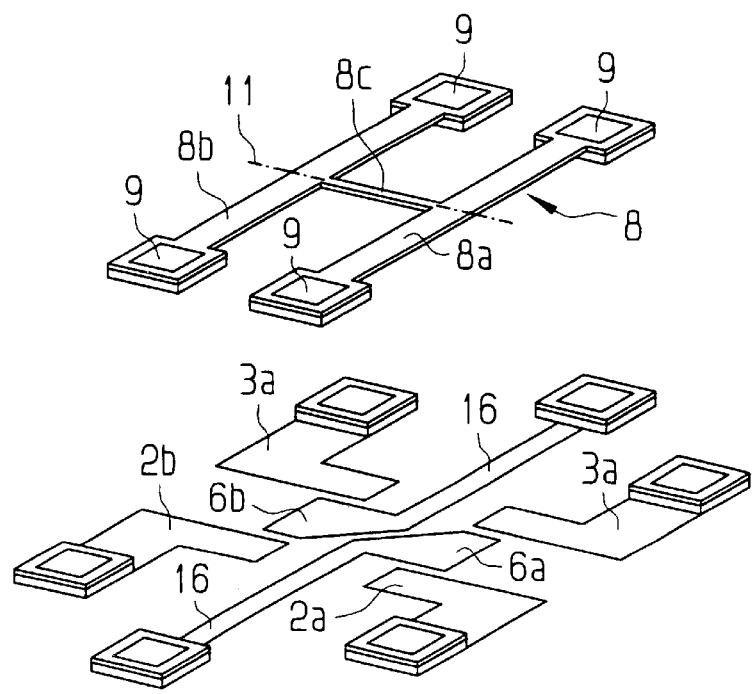
FIG. 6 shows the third embodiment of the filter according to the present invention in an exploded diagram.

FIGS. 5 and 6 illustrate a third embodiment of the filter according to the present invention in a perspective view and in an exploded diagram. The vibrating body in this embodiment has two parallel bar-shaped partial bodies 8a and 8b joined by a narrow arm 8c in the area of central node 11 of the vibration.

Vibrating body 8 is connected to substrate 1 at longitudinal ends 9 of each individual partial body 8a, 8b; otherwise it is held at a distance from substrate 1 with a narrow gap. Electrodes 2a, 3a, 6a and 2b, 3b, 6b run beneath partial bodies 8a, 8b on the surface of substrate 1. Electrodes 2a, 3a and 2b, 3b are each located in the area of antipodes 12, 13 of their respective partial bodies 8a and 8b, and electrodes 6a, 6b are each beneath node 11. Electrodes 2a, 3a are provided so they can be connected to an input signal, as described above with respect to electrodes 2, 3 of the embodiment from FIG. 1. Electrodes 2b, 3b are provided like electrodes 4, 5 in the embodiment in FIG. 1 to be connected to output terminals of the filter. Electrodes 2a, 3a thus have the function of exciting the first harmonic of the fundamental mode of the bending vibration of partial body 8a. This vibration results in a vibrating rotational motion of partial body 8a in the area of node 11.

This rotational motion exerts a torsional moment on arm 8c which is propagated over this arm to the second partial body 8b, also exciting it to vibration. The vibration of partial body 8b is detected by the respective electrodes 2b, 3b.

One advantage of this embodiment is that an arm 8c between two partial bodies 8a, 8b makes it possible to position the two partial bodies and thus also electrodes 2a, 2b and 3a, 3b at a great distance from one another, thus reducing the capacitive feedthrough from an input electrode 2a, 3a to the opposite output electrode 2b, 3b through the material of substrate 1. Furthermore, capacitive feedthrough over the vibrating body itself is also reduced because the charge shifts induced by the input signal are limited essentially to partial body 8a, because an induced charge exchange takes place over the long and narrow arm 8c only to a small extent.

In the case of the electrode arrangement shown here, the fact that feeder lines 16 of control electrodes 6a, 6b run between the opposite input and output electrodes 2a, 2b and 3a, 3b and thus electrically shield the input and output electrodes from one another also contributes toward a reduction in capacitive feedthrough.

Each of the two partial bodies 8a, 8b is assigned its own control electrode 6a, 6b. Different potentials may be applied to the two control electrodes. It is thus possible to tune the two partial bodies to different resonant frequencies. In this way the bandwidth allowed to pass through the filter can be made broader or narrower to adjust it to a specific application by setting a greater or smaller difference between the two resonant frequencies. With the two-part vibrating body and the two control electrodes 6a, 6b, it is not only possible to control the mid-frequency of the pass range of the filter but also the bandwidth can be varied.

Another embodiment of a filter according to the present invention is illustrated in FIG. 7. As in the embodiment described previously, vibrating body 8 includes two partial bodies 8a, 8b at a distance above the surface of a substrate 1. Bar-shaped partial bodies 8a, 8b are joined to one another and to pads 15 on the surface of substrate 1 by long narrow torsionable arms 8c and 8d. These arms 8c, 8d each act on the longitudinal sides of partial bodies 8a, 8b at a distance from the longitudinal ends of the partial bodies corresponding to approximately one-fourth the length of the partial bodies.

Input electrodes 2a, 2b are arranged on the surface of substrate 1 beneath the central area of partial body 8a and beneath its longitudinal ends. They excite a fundamental mode of the first partial body 8a having antipodes on the longitudinal ends and in the center, as well as nodes in the area of arms 8c, 8d. Arms 8c transmit a torsion moment resulting from the vibration to the second partial body 8b, thus exciting it to a corresponding vibration. This can be picked up with the help of output electrodes 2b, 3b arranged beneath the center or the longitudinal ends of partial body 8b in accordance with the arrangement of electrodes 3a, 2a. In this embodiment, effective capacitive decoupling of the input and output electrodes is again achieved due to the spatial separation with the help of arms 8c and due to the charge exchange between partial bodies 8a, 8b, which is reduced due to the narrow shape of these arms.

As in the case of the examples described above, control electrodes (not shown) are arranged beneath the partial bodies in the area of the vibration nodes to control their resonant frequencies.

Although the present invention was described above on the basis of a preferred embodiment, it is not limited to this embodiment but instead can be modified in a variety of ways.

In particular, the geometries illustrated here are shown only as an example and can be replaced through other suitable geometries.

What is claimed is:

1. A filter for an electric signal, comprising:
   a substrate;
   a vibrating body capable of vibrating with at least two antipodes deflected in phase opposition relative to the substrate; and
   a plurality of electrodes arranged on the same surface of the substrate facing the vibrating body and including a first set of electrodes connected to a signal input and a second set of electrodes connected to a signal output, wherein:
      the first set of electrodes is capable of performing an electric exciting of a vibration of the vibrating body,
      the second set of electrodes detects the vibration of the vibrating body, and
      each of the second set of electrodes is assigned to the at least two antipodes and is connected to two separate terminals of the signal output.

2. The filter according to claim 1, further comprising:
   a device integrated into the substrate and including at least one of a circuit for preprocessing the electric signal and a circuit for post-processing the electric signal.

3. The filter according to claim 1, wherein:
   the vibration is antisymmetrical, and
   the plurality of electrodes are each arranged symmetrically with respect to a plane of symmetry of the vibration.

4. The filter according to claim 1, wherein:
   the vibration is a first harmonic of a fundamental mode of a bending vibration of the vibrating body.

5. The filter according to claim 1, further comprising:
   a control electrode that is associated with an area and is arranged between the at least two antipodes, wherein:
      the control electrode receives a control potential for tuning a resonant frequency of the vibrating body.

6. The filter according to claim 1, wherein:
   one of the first set of electrodes connected to the signal input and for exciting the vibration and one of the second set of electrodes connected to one of the two separate terminals of the signal output and for detecting the vibration are each arranged in an area of the at least two antipodes.

7. The filter according to claim 1, wherein:
   one of the first set of electrodes is arranged in an area of the at least two antipodes and is capable of being connected according to a time division multiplexing to a terminal of the signal input for exciting the vibration and to one of the two separate terminals of the signal output for detecting the vibration.

8. The filter according to claim 1, wherein:
   the vibrating body includes at least one bar, and
   longitudinal ends of the at least one bar are connected to the substrate.

9. The filter according to claim 1, wherein:
   the vibrating body includes at least one bar provided with arms acting at nodes of the vibration, and
   the arms are connected to the substrate.

10. The filter according to claim 1, wherein:
    the vibrating body includes two coupled partial bodies, and
    at least one of the first set of electrodes connected to the signal input and for exciting the vibration and at least one of the second set of electrodes connected to the signal output and for detecting the vibration are provided on one of the two coupled partial bodies.

11. The filter according to claim 10, further comprising:
    at least one arm arranged in an area of a node of the vibration, wherein:
       the two coupled partial bodies are connected by the at least one arm.

12. The filter according to claim 10, further comprising:
    a first control electrode arranged opposite a first partial body of the two coupled partial bodies;
    a second control electrode arranged opposite a second partial body of the two coupled partial bodies, wherein:
       the first control electrode and the second control electrode are arranged in an area between the at least two antipodes of the vibration, and
       the first control electrode and the second control electrode are capable of being acted upon by a control potential for tuning a resonant frequency of a respective one of the two coupled partial bodies.

13. The filter according to claim 1, wherein:
    the substrate and the vibrating body are formed in one piece from a semiconductor material.

* * * * *